(12) United States Patent
Mallela et al.

(10) Patent No.: US 10,283,416 B2
(45) Date of Patent: *May 7, 2019

(54) VERTICAL FETS WITH VARIABLE BOTTOM SPACER RECESS

(71) Applicant: International Business Machines Corporation, Armonk, NY (US)

(72) Inventors: Hari V. Mallela, Poughquag, NY (US); Reinaldo A. Vega, Wappingers Falls, NY (US); Rajasekhar Venigalla, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/869,761

(22) Filed: Jan. 12, 2018

(65) Prior Publication Data

US 2018/0138091 A1 May 17, 2018

Related U.S. Application Data

(63) Continuation of application No. 15/201,943, filed on Jul. 5, 2016, now Pat. No. 9,929,058, which is a
(Continued)

(51) Int. Cl.
*H01L 27/092* (2006.01)
*H01L 21/8238* (2006.01)
(Continued)

(52) U.S. Cl.
CPC .. *H01L 21/82385* (2013.01); *H01L 21/02263* (2013.01); *H01L 21/26566* (2013.01);
(Continued)

(58) Field of Classification Search
CPC ............... H01L 27/092; H01L 27/0922; H01L 29/0653; H01L 29/78642; H01L 21/82385;
(Continued)

(56) References Cited

U.S. PATENT DOCUMENTS 9,437,503 B1 * 9/2016 Mallela ............... H01L 21/8238
9,761,727 B2 * 9/2017 Mallela ............... H01L 21/8238
(Continued)

OTHER PUBLICATIONS

List of IBM Patents or Patent Applications Treated as Related—Date Filed: Jan. 12, 2018; 2 pages.

*Primary Examiner* — Feifei Yeung Lopez
(74) *Attorney, Agent, or Firm* — Cantor Colburn LLP; Vazken Alexanian

(57) ABSTRACT

A method of forming a variable spacer in a vertical transistor device includes forming a first source/drain of a first transistor on a substrate; forming a second source/drain of a second transistor on the substrate adjacent to the first source/drain, an isolation region arranged in the substrate between the first source/drain and the second source/drain; depositing a spacer material on the first source/drain; depositing the spacer material on the second source/drain; forming a first channel extending from the first source drain and through the spacer material; forming a second channel extending from the second source/drain and through the spacer material; wherein the spacer material on the first source/drain forms a first spacer and the spacer material on the second source/drain forms a second spacer, the first spacer being different in thickness than the second spacer.

20 Claims, 9 Drawing Sheets

Related U.S. Application Data continuation of application No. 14/978,197, filed on Dec. 22, 2015, now Pat. No. 9,437,503.

(51) Int. Cl.

| | |
|---|---|
| *H01L 21/02* | (2006.01) |
| *H01L 21/32* | (2006.01) |
| *H01L 21/265* | (2006.01) |
| *H01L 29/423* | (2006.01) |
| *H01L 29/49* | (2006.01) |
| *H01L 29/786* | (2006.01) |
| *H01L 29/06* | (2006.01) |

(52) U.S. Cl.
CPC .......... *H01L 21/32* (2013.01); *H01L 21/8238* (2013.01); *H01L 21/823807* (2013.01); *H01L 21/823814* (2013.01); *H01L 21/823842* (2013.01); *H01L 21/823864* (2013.01); *H01L 21/823885* (2013.01); *H01L 27/092* (2013.01); *H01L 27/0922* (2013.01); *H01L 29/0653* (2013.01); *H01L 29/42392* (2013.01); *H01L 29/4966* (2013.01); *H01L 29/78618* (2013.01); *H01L 29/78642* (2013.01); *H01L 29/78696* (2013.01); *H01L 2029/42388* (2013.01)

(58) Field of Classification Search
CPC ..... H01L 21/823864; H01L 21/826885; H01L 29/66803; H01L 29/78618; H01L 29/78696

See application file for complete search history.

(56) References Cited

U.S. PATENT DOCUMENTS

| | | | |
|---|---|---|---|
| 2015/0380548 A1* | 12/2015 | Wang | .................. H01L 29/7827 257/329 |
| 2017/0178959 A1 | 6/2017 | Mallela et al. | |

* cited by examiner

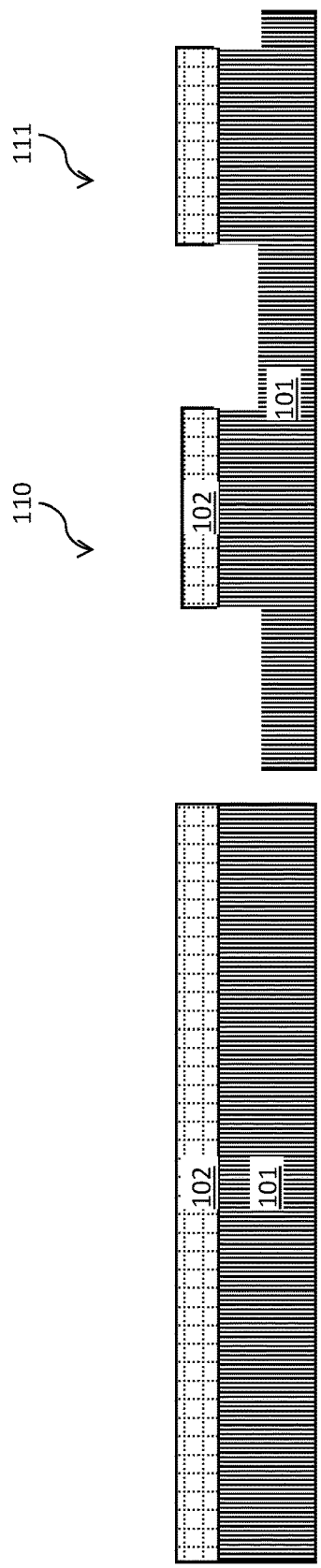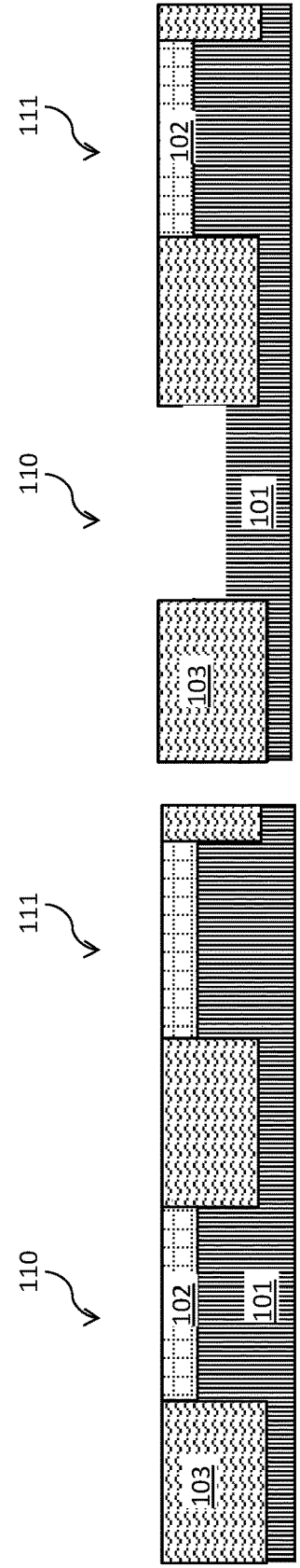

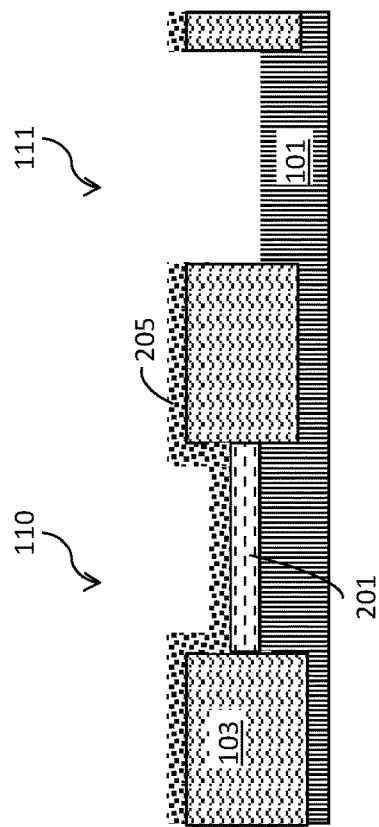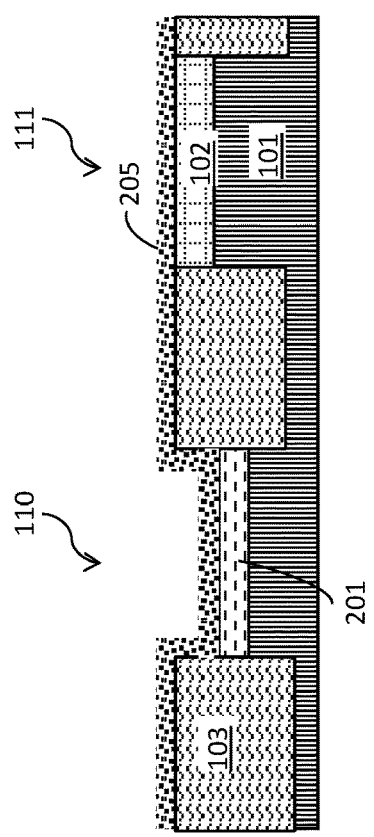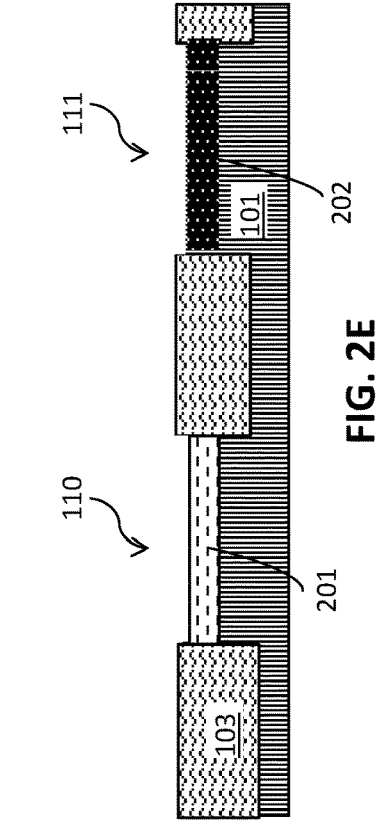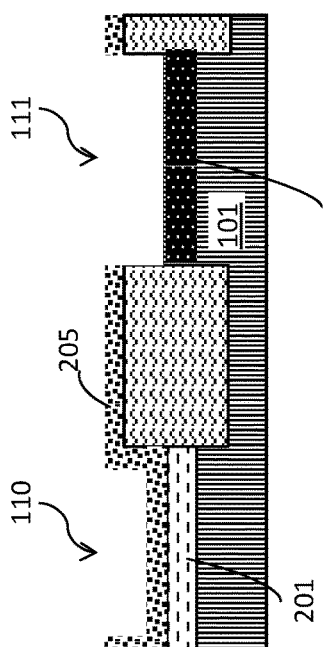

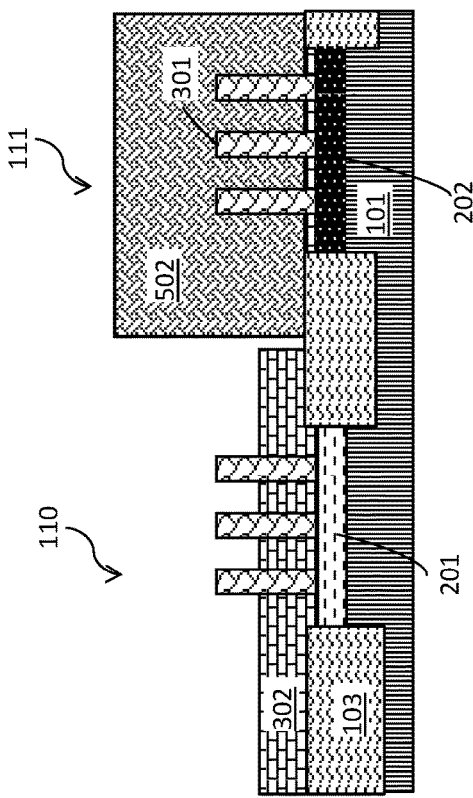
FIG. 5A
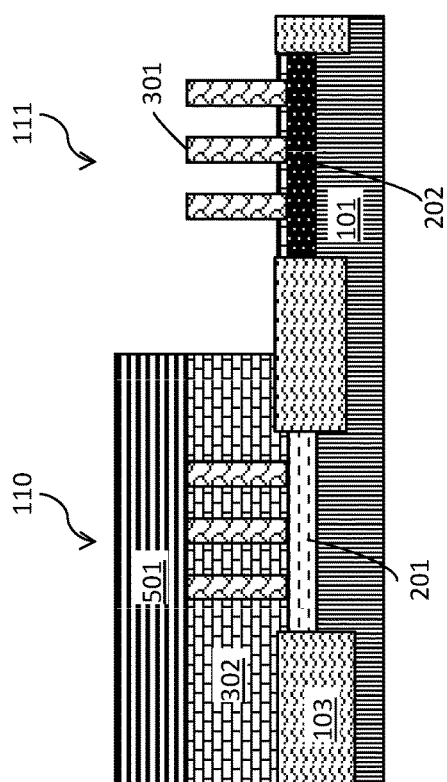
FIG. 5B
FIG. 5C
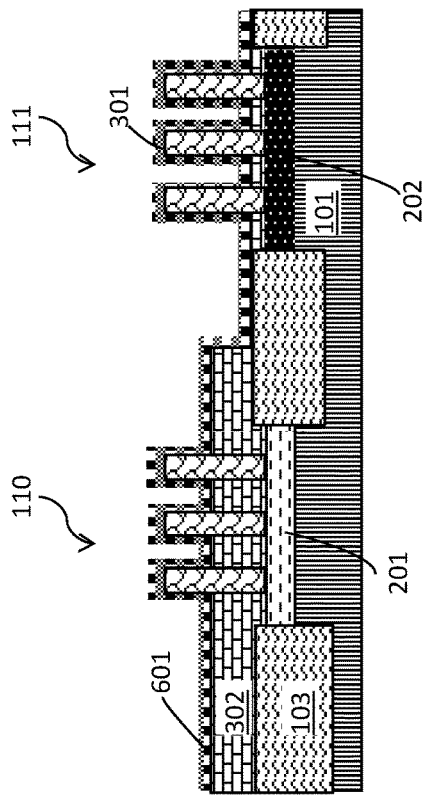
FIG. 6A
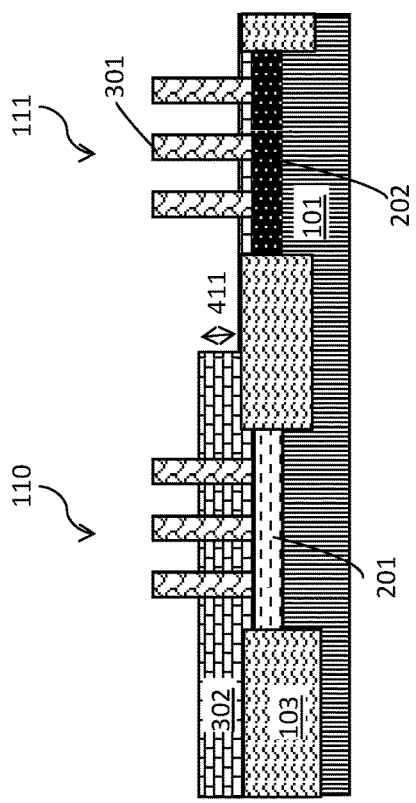

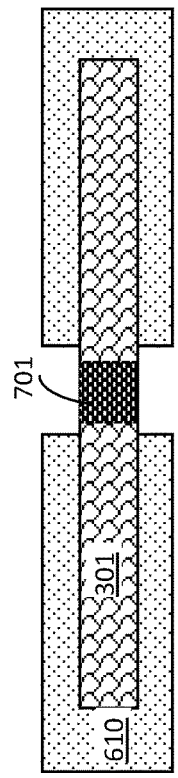
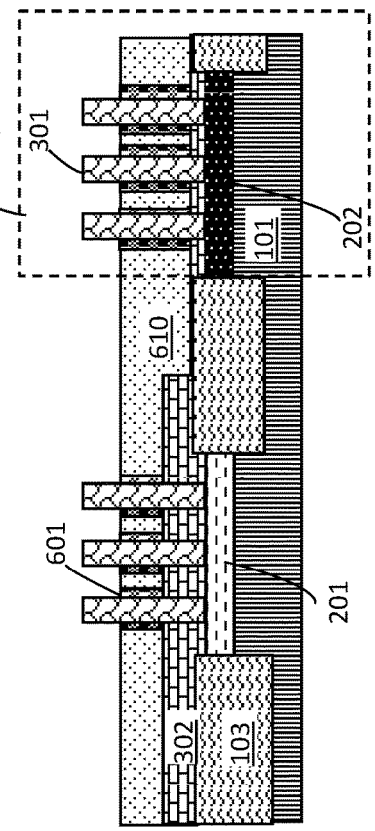
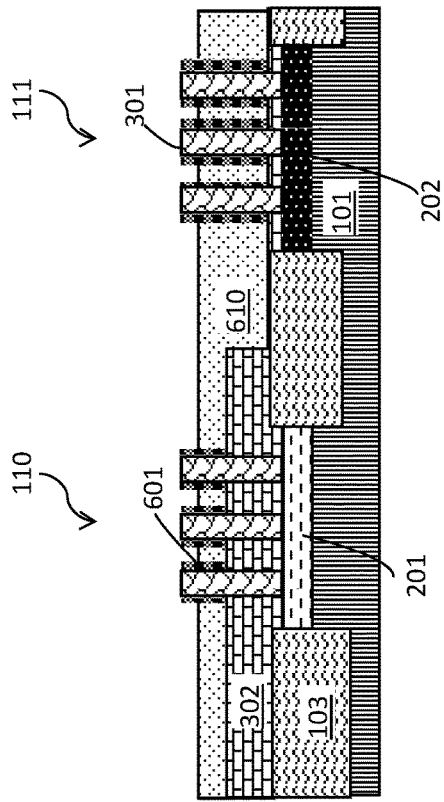
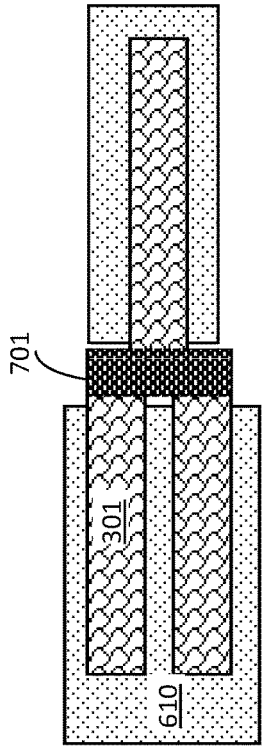
FIG. 7B
FIG. 8A
FIG. 8B
FIG. 9A

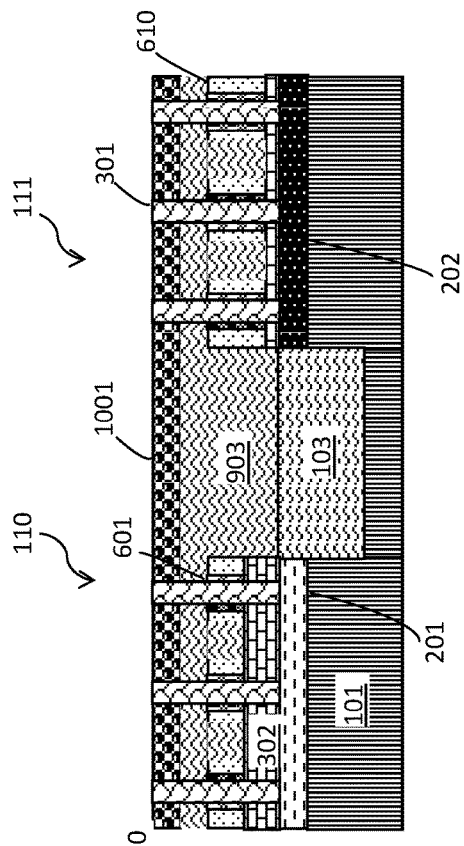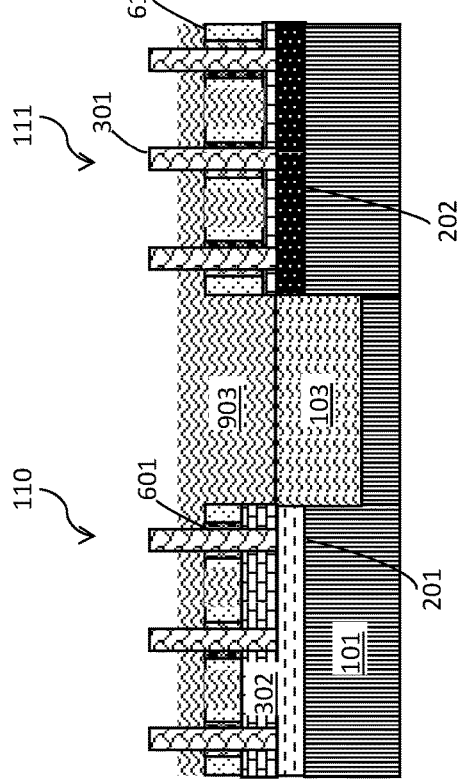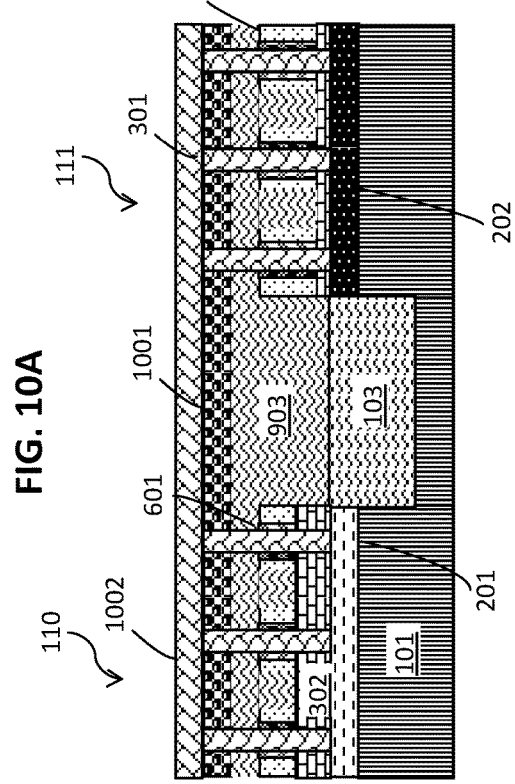
FIG. 10A
FIG. 10B
FIG. 10C
FIG. 10D

VERTICAL FETS WITH VARIABLE BOTTOM SPACER RECESS

DOMESTIC PRIORITY

This application is a continuation of and claims priority from U.S. patent application Ser. No. 15/201,943, entitled "VERTICAL FETS WITH VARIABLE BOTTOM SPACER RECESS," filed on Jul. 5, 2016, which is a continuation of and claims priority from U.S. patent application Ser. No. 14/978,197, filed on Dec. 22, 2015, entitled "VERTICAL FETS WITH VARIABLE BOTTOM SPACER RECESS," the entire contents of both applications are incorporated herein by reference.

BACKGROUND

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

When a MOSFET is scaled down through various technology nodes, several techniques are employed to improve device performance. Some CMOS devices are fabricated using a self-aligned source/drain process in which the source and drain junction overlap to the gate is substantially the same. The result is that any effort to increase the source overlap may also increase the drain overlap, which reduces the device on-state resistance and increases the drive current.

SUMMARY

According to an embodiment, a method of forming a variable spacer in a vertical transistor device includes forming a first source/drain of a first transistor on a substrate; forming a second source/drain of a second transistor on the substrate adjacent to the first source/drain, an isolation region arranged in the substrate between the first source/drain and the second source/drain; depositing a spacer material on the first source/drain; depositing the spacer material on the second source/drain; forming a first channel extending from the first source drain and through the spacer material; forming a second channel extending from the second source/drain and through the spacer material; wherein the spacer material on the first source/drain forms a first spacer and the spacer material on the second source/drain forms a second spacer, the first spacer being different in thickness than the second spacer.

According to another embodiment, a method of forming a variable spacer in a vertical transistor device includes forming a first source/drain of a first transistor on a substrate; forming a second source/drain of a second transistor on the substrate adjacent to the first source/drain, an isolation region arranged in the substrate between the first source/drain and the second source/drain; depositing a spacer material on the first source/drain and the second source/drain; forming first channels in the spacer material extending from the first source/drain and second channels in the spacer material extending from the second source/drain; depositing a first block mask on spacer material of the first transistor; recessing the spacer material of the second transistor to form a spacer on the second source/drain and around the second channels, and then removing the first block mask; depositing a second block mask on spacer arranged on the second source/drain; and recessing the spacer material arranged of the first transistor to form a spacer on the first source/drain and around the first channels, and then removing the second block mask; wherein the spacer of the first transistor is different in thickness than the spacer of the first transistor.

Yet, according to another embodiment, a semiconductor device includes a first source/drain of a first transistor arranged on a substrate; a second source/drain of a second transistor arranged on the substrate adjacent to the first source/drain, an isolation region arranged in the substrate between the first source/drain and the second source/drain; a first spacer arranged on the first source/drain, a first channel extending from the first source/drain through the first spacer; a second spacer arranged on the second source/drain, a second channel extending from the second source/drain through the second spacer, the first spacer and the second spacer having different thicknesses; and a first gate stack arranged along sidewalls of the first channel and in contact with the first spacer, and a second gate stack arranged along sidewalls of the second channel and in contact with the second spacer.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-10G illustrate exemplary methods of making variable spacers in a vertical transistor according to embodiments, in which:

FIG. 1A is a cross-sectional side view after depositing a nitride layer on a substrate;

FIG. 1B is a cross-sectional side view after patterning the nitride layer and recessing the substrate;

FIG. 1C is a cross-sectional side view after depositing a dielectric in the recessed substrate and planarizing to form isolation regions between a first transistor area and a second transistor area;

FIG. 2A is a cross-sectional side view after removing the nitride layer and recessing the substrate in the first transistor area;

FIG. 2B is a cross-sectional side view forming a first drain in the first transistor area and depositing a hard mask on the first and second transistor areas;

FIG. 2C is a cross-sectional side view after patterning and recessing the second drain area of the second transistor;

FIG. 2D is a cross-sectional side view after forming a second drain in the second transistor area;

FIG. 2E is a cross-sectional side view after removing the hard mask and recessing the isolation region material;

FIG. 5A is a cross-sectional side view after depositing a mask, patterning the mask over the second transistor area, and recessing the first spacer material in the second transistor area;

FIG. 5B is a cross-sectional side view after removing the mask and depositing another mask on the second transistor area and recessing the first spacer material in the first transistor area;

FIG. 5C is a cross-sectional side view after removing the mask;

FIG. 6A is a cross-sectional side view after depositing a work function metal stack;

FIG. 7B is a cross-sectional side view after recessing the gate metal;

FIG. 8A is a top view of a tip-to-tip channel gate contact according to an embodiment;

FIG. 8B is a top view of a side-by-side and to tip gate contact according to an embodiment;

FIG. 9A is an expanded cross-sectional side view of the second transistor area after recessing the work function metal around the channels;

FIG. 10A is a cross-sectional side view after recessing the second spacer material;

FIG. 10B is a cross-sectional side view after depositing an interlayer dielectric (ILD) on the second spacer material;

FIG. 10C is a cross-sectional side view after depositing a hard mask on the ILD;

FIG. 10D is a cross-sectional side view after patterning and etching through the ILD over the channel regions of the first transistor;

FIG. 10G is a cross-sectional side view after forming a source over the channel regions in the second transistor.

DETAILED DESCRIPTION

Figure 3A:
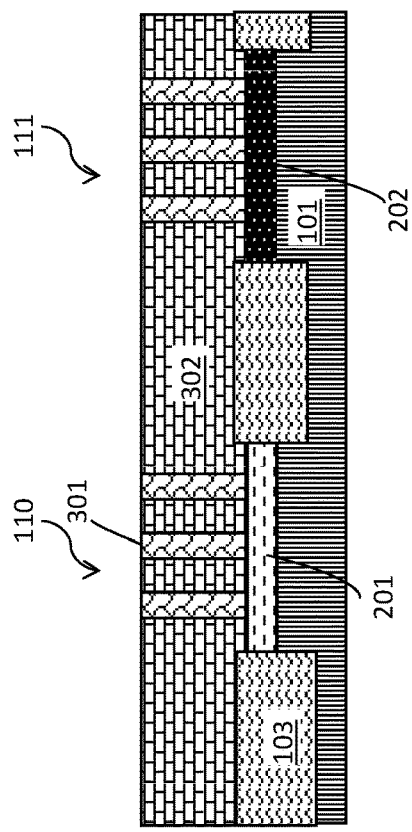
FIG. 3A is a cross-sectional side view after depositing a first spacer material and planarizing.

Although using a self-aligned source/drain process, in which the source overlap and the drain overlap are substantially the same, can increase drive current, there are challenges associated with increasing the drain overlap that are not associated with increasing the source overlap. For example, gate-induced drain leakage (GIDL) may increase, which can also increase the leakage floor of the device. Such leakage may be particularly challenging with alternate channel materials that have a lower bandgap than silicon because the lower bandgap may exacerbate the GIDL. Further, increasing the gate-to-drain overlap capacitance (Cgd) may also increase the Miller Effect during logic switching operations, which can increase device delay and power consumption.

Accordingly, described herein are methods of forming vertical field effect transistors (VFETs) that permit the independent modulation of source and drain overlap to the gate. The source overlap may be optimized for resistance, while the drain overlap may be optimized for GIDL and Cgd. The different drain overlap values are achieved on different devices within the same chip or wafer.

Turning now to the Figures, FIGS. 1A-10G illustrate exemplary methods of making a variable spacers in a vertical transistor according to embodiments. FIG. 1A is a cross-sectional side view after depositing a nitride layer 102 on a substrate 101. The substrate 101 may include one or more semiconductor materials. In an exemplary embodiment, the substrate 101 includes silicon. Other non-limiting examples of suitable substrate 101 materials include SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The nitride layer 102 may be a pad nitride layer and include, for example, silicon nitride. The nitride layer 102 may be deposited by a deposition process, for example, chemical vapor deposition (CVD), liquid phase chemical vapor deposition (LPCVD), or physical vapor deposition (PVD).

FIG. 1B is a cross-sectional side view after patterning the nitride layer 102 and recessing the substrate 101. The nitride layer 102 may be patterned by lithography and etching. The pattern from the patterned nitride layer 102 is transferred into the substrate 101 by performing an etch process to recess the substrate 101 in the areas between the patterned nitride 102 layer. Recessing the substrate 101 forms isolation trenches in the substrate 101.

The isolation trenches are formed between a first transistor 110 and a second transistor 111. The first transistor 110 and the second transistor 111 may be different types of transistors, for example, an nFET or a pFET. The first transistor 110 may be an nFET in some embodiments and a pFET in other embodiments. The second transistor 111 may be an nFET in some embodiments and a pFET in other embodiments.

FIG. 1C is a cross-sectional side view after depositing a dielectric in the recessed substrate 101 to form shallow trench isolation (STI) regions 103 between the first transistor 110 area and a second transistor 111 area. The dielectric may be a dielectric oxide, for example, silicon dioxide. Other non-limiting examples of suitable dielectric materials for the isolation regions include tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof. After depositing the dielectric material within the isolation trenches in the substrate 101 and on the patterned nitride layer 102, the dielectric is planarized/polished by, for example, chemical mechanical planarization (CMP). Planarization removes excess dielectric from the surface of the nitride layer 102 such that the surface of the STI region 103 is substantially flush with the surface of the nitride layer 102.

FIG. 2A is a cross-sectional side view after removing the nitride layer 102 and recessing the substrate 101 in the first transistor 110 area between the STI regions 103. The nitride layer 103 may be removed by, for example, a phosphoric acid wet etch. The substrate 101 is recessed or patterned to form a source/drain in the first transistor 110.

FIG. 2B is a cross-sectional side view forming a first drain 201 in the first transistor area 110 and depositing a hard mask 205 on the first and second transistor 110, 111 areas. The first drain 201 may be formed by performing an epitaxial growth process to form an epitaxial layer on the substrate 101. The first drain 201 also may be formed by incorporating dopants into the substrate 101.

The epitaxial layers may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The epitaxial layers may include, for example, silicon, germanium, or silicon germanium. A number of different sources may be used for the deposition of the epitaxial layers. In some embodiments, the gas source for the deposition of epitaxial semiconductor material include a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

After forming the first drain 201, the hard mask 205 is deposited on the first transistor 110 and the second transistor 111. The hard mask 205 may be a dielectric oxide, for example, silicon dioxide. The hard mask 205 may be deposited by a deposition process including, but not limited to CVD, PVD, plasma enhanced CVD, atomic layer deposition (ALD), evaporation, chemical solution deposition, or like processes. The hard mask 205 covers the first drain 201. The hard mask 205 will be used for patterning the drain in the second transistor 111.

FIG. 2C is a cross-sectional side view after patterning and recessing the second drain area of the second transistor 111. The hard mask 205 is patterned/etched between the STI regions 103 in the second transistor 111. The nitride layer 102 is removed in the second transistor 111, and the substrate 101 is recessed beneath the nitride layer 102 to pattern the drain area of the second transistor 111.

FIG. 2D is a cross-sectional side view after forming a second drain 202 in the second transistor 111 area. The second drain 202 may include an epitaxial layer or be formed by incorporating dopants into the substrate 101, as described above for drain 201 in FIG. 2B. The hard mask 205 protects the first drain 201 in the first transistor 110 area.

FIG. 2E is a cross-sectional side view after removing the hard mask 205 and recessing the material forming the STI regions 103. Although the drains (first drain 201 and second drain 202) are formed before the sources in the exemplary embodiment illustrated in the figures, the source may be formed before the drain in other embodiments. For example, first drain 201 and second drain 202 may be sources in other embodiments (source/drain), or first drain 201 may be first source/drain and second drain 202 may be second source/drain.

FIG. 3A is a cross-sectional side view after depositing a first spacer material 302 and planarizing. The first spacer material 302 is disposed on the first drain 201, second drain 202, and STI regions 103. The first spacer material 302 may be a low-k dielectric material. The low-k dielectric material may include Si, N, and C or B. Additionally, the low-k dielectric material may include Si, N, B, and C. For example, the low-k dielectric material may include SiBN, SiCN, SiBCN, or any combination thereof. The first spacer material 302 may be deposited by a deposition process, for example, chemical vapor deposition (CVD) or physical vapor deposition (PVD). The first spacer material 302 is then planarized by a method such as CMP.

Figure 3B:
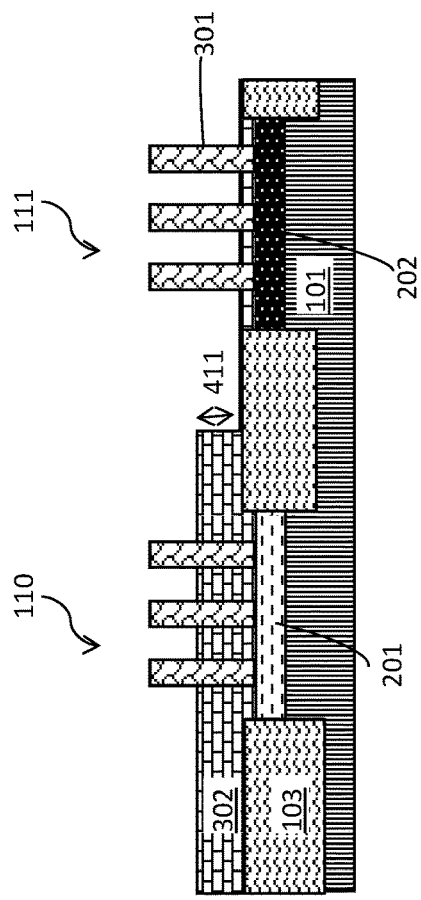
FIG. 3B is a cross-sectional side view after patterning the first spacer material and forming channels over the drains within the spacer material.

FIG. 3B is a cross-sectional side view after patterning the first spacer material 302 and forming a channel 301 (or channels) within the first spacer material 302 over the first drain 201 and the second drain 202. These fins are patterned in the first spacer material 302 by lithography and etching. One or more, or any array, of trenches is patterned in the first spacer material 302. The fin trenches extend from a surface of the first spacer material 302 to the first drain 201 and the surface of the first spacer material 302 to the second drain 202. The channel 301 is formed in the trenches over the first drain 201 and the second drain.

The channel 301 may be formed by performing an epitaxial growth process to form an epitaxial growth that extends from the first or second drain 201, 202 and through the first spacer material 302. The epitaxial growth may be formed by a suitable epitaxial growth process as described above in FIG. 2B. Although the channel 301 may include an epitaxial growth, the channel 301 is not limited to an epitaxial growth and may be formed by other suitable methods. Although three trenches and channels 301 are formed over each of the first drain 201 and the second drain 202, any number of channels 301 may be formed over each source/drain of the first and second transistors 110, 111.

Figure 4A:
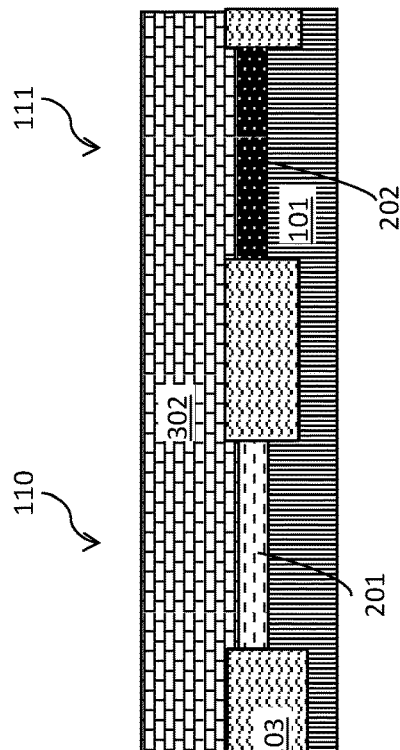
FIG. 4A is a cross-sectional side view after depositing a mask, patterning the mask over the second transistor area, and partially recessing the first spacer material in the second transistor area.
Figure 4B:
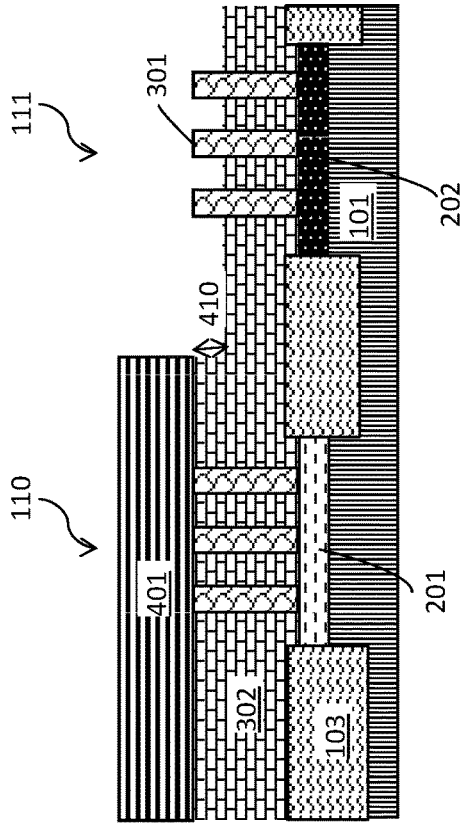
FIG. 4B is a cross-sectional side view after removing the mask and simultaneously etching the first spacer material in the first transistor area and the second transistor area.

FIGS. 4A-4B illustrate methods of forming first spacers (bottom spacers) having different thicknesses according on an embodiment, and FIGS. 5A-5C illustrate methods according to another embodiment. The embodiment shown in FIGS. 4A and 4B use a single mask, and the embodiment shown in FIGS. 5A-5C use two masks.

FIG. 4A is a cross-sectional side view after depositing a mask 401, patterning the mask 401 over the second transistor 111 area, and partially recessing the first spacer material 302 in the second transistor 111 area. The mask 401 is deposited on the first transistor 110 and the second transistor 111. The mask 401 may be, for example, a hard mask material or a resist, such as a polymeric material. A portion of the mask 401 is removed over the second transistor 111 to pattern the mask 401 and expose the first spacer material 302 in the second transistor 111 area.

The first spacer material 302 may be recessed by a dry etch process, a wet etch process, or both a dry etch process and a wet etch process. In an exemplary embodiment, the dry etch process is RIE.

The first spacer material 302 is partially etched/recessed in the second transistor 111 area relative to the first transistor area 110. The first spacer material 302 is recessed by an amount 410 such that the first spacer material 302 is thinner in the second transistor 111 area compared to the protected first transistor 110 area. The partial etch process partially exposes the channels 301 in the second transistor 111 area. In an exemplary embodiment, the first spacer material 302 in the second transistor area 111 is recessed by an amount 410 from about 1 nm to about 30 nm FIG. 4B is a cross-sectional side view after removing the mask 401 and simultaneously etching the first spacer material 302 in the first transistor 110 area and the second transistor 111 area. The first spacer material 302 may be etched by a dry etch process and/or a wet etch process as described above in FIG. 4A. After performing the final etch, spacers having different thicknesses are formed in the first transistor 110 area and the second transistor 111 area. The first spacer material 302 is the first transistor 110 has a thickness that is different than the first spacer material 302 in the second transistor 111. As shown in the exemplary embodiment, first spacer material 302 in the first transistor 110 is thicker than the first spacer material 302 in the second transistor 111 area. The difference in thicknesses 411 between the two transistors may be about 1 nm to about 30 nm in some embodiments.

FIG. 5A is a cross-sectional side view after depositing a first mask 501, patterning the first mask 501 over the second transistor 111 area, and recessing the first spacer material 302 in the second transistor 111 area. In contrast to the embodiment shown in FIG. 4A, the first spacer material 302 is recessed to the final desired height in the second transistor 111 area.

FIG. 5B is a cross-sectional side view after removing the first mask 501 and depositing a second mask 502 on to protect the formed spacer and second drain 202 of the second transistor 111 area and recessing the first spacer material 302 in the first transistor 110 area. The second mask 502 protects the formed spacer in the second transistor 111 so that the first spacer material 302 in the first transistor 110 area may be independently recessed to the final desired height.

FIG. 5C is a cross-sectional side view after removing the second mask 502 to reveal spacers having different thicknesses in the first and second transistor 110, 111 areas, as described in FIG. 4B.

In addition to the embodiments shown in FIGS. 4A-4B and 5A-5C, a gas cluster ion beam (GCIB) process may be used to form variable thickness spacers (first spacer arranged on the source/drain). GCIB may be used to implant a stream of molecule clusters (as opposed to a stream of ions) that dissociate upon impact to the substrate surface and leave behind a material of choice. GCIB also can be used to etch substrate materials away. Because GCIB is a directional process that is dictated by the angle and tilt of the implant beam, the process may be sued to deposit a spacer material (e.g., oxide, nitride, etc.) on one sidewall of a fin, for example, but not the other sidewall. Thus, a vertical GOB implant may be used to deposit a dielectric spacer material between the channels 301 after the channels 301 without resulting in any channel sidewall coverage that would otherwise have to be subsequently removed. The dielectric spacer material also may be deposited before forming the channels 301.

In some embodiments, a block mask may be deposited onto first transistor 110 or second transistor 111, and GCIB may be used to form a spacer on the exposed drain. Then, the mask can be removed, and a spacer having a different thickness may be formed on the other drain. One or more masks may be used, as described above.

In other embodiments, GCIB deposition of the spacer material on the first source/drain is performed separately from the GCIB deposition of the spacer material on the second source/drain. The spacer material forming the first spacer over the first source/drain and/or the spacer material forming the second spacer over the second source/drain may not be subsequently etched after deposition.

FIG. 6A is a cross-sectional side view after depositing a work function metal stack 601 on the exposed channels 301. To form the work function metal stack 601, a dielectric material may be disposed on sidewalls and surfaces of the channels 301 and first spacer material 302 and then a work function metal may be disposed on the dielectric material.

The dielectric material can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of materials used.

The work function metal(s) may be disposed over the gate dielectric material. The type of work function metal(s) depends on the type of transistor and may differ between the first transistor 110 and the second transistor 111. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

Figure 6C:
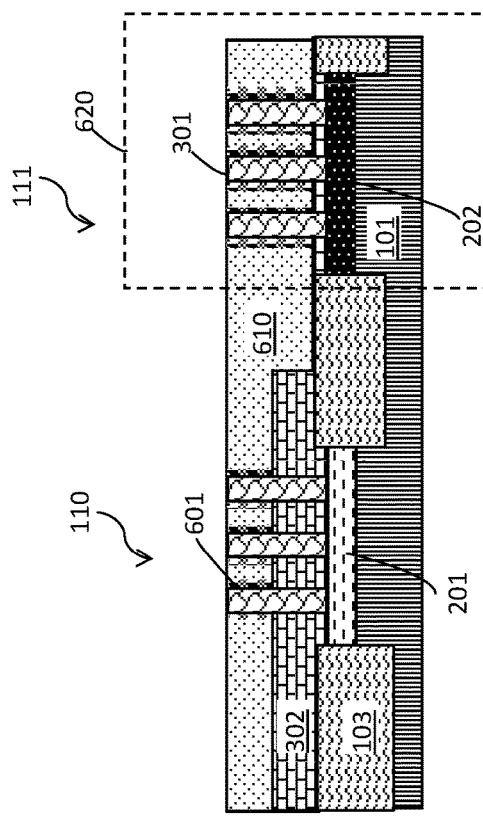
FIGS. 6C and 6D are a cross-sectional side view and a top view of the second transistor, respectively, after depositing a gate metal and planarizing.
Figure 6B:
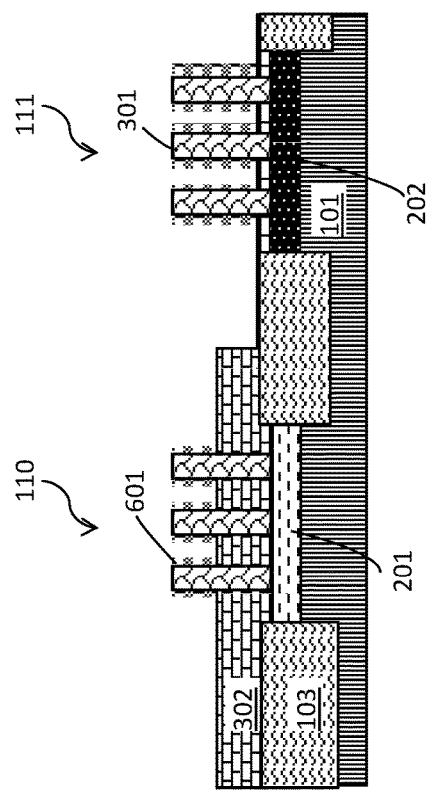
FIG. 6B is a cross-sectional side view after removing the work function metal stack from the first spacer material.

FIG. 6B is a cross-sectional side view after removing the work function metal stack 601 from the surface of the first spacer material 302 and the surface of the channel 301. The work function metal stack 601 may be removed by a reactive ion etch (ME). The work function metal stack 601 remains disposed on sidewalls of the channels 301.

Figure 6D:
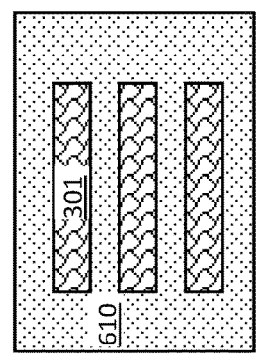

FIGS. 6C and 6D are a cross-sectional side view and a top view of the second transistor 111 in region 620, respectively, after depositing a gate metal 610 and planarizing the gate metal 610. The work function metal stack 601 and the gate metal 610 form a gate stack. The gate stacks are arranged on the first spacer material 302 and along sidewalls of the channels 301. The gate metal 610 is a conductive metal that is deposited over the work function metal stack 601. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal to expose the surface of the channels 301.

Figure 7A:
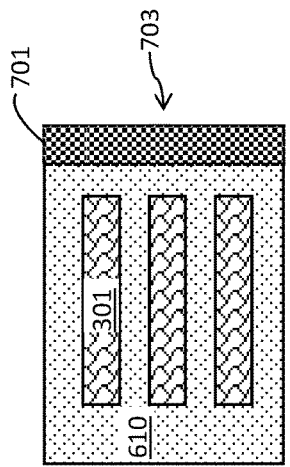
FIG. 7A is a top view after depositing an oxide and patterning the oxide to form a side-by-side gate contact pattern.

FIG. 7A is a top view of FIG. 6D after depositing an oxide 701 and patterning (removing) the oxide 701 over the channel 301 regions to form a side-by-side gate contact according to an embodiment. The oxide 701 is deposited on both the first transistor 110 and the second transistor 111, but the second transistor 111 is only shown in FIG. 7A. Non-limiting examples of oxides 701 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

A portion of the oxide 701 is removed by etching to pattern the gate contact. The portion of the oxide 701 remaining perpendicular to the channels in the area 703 will form the gate contact in subsequent steps, after forming the source in FIG. 10G.

FIG. 7B is a cross-sectional side view after recessing the gate metal 610. Referring again to FIG. 7A, the gate metal 610 is protected by the the oxide 701 in the gate contact in area 703 and will not be recessed. The gate metal 610 may be recessed by, for example, a reactive ion etch (ME) or a wet etch. The gate metal 610 may be recessed by about 10 nm to about 100 nm.

Although the gate contact may be formed in a side-by-side channel configuration as shown in FIG. 7A for the exemplary embodiment illustrated, the gate contact may also be formed in other configurations, which depends on the orientation of the gates in the devices. FIG. 8A is a top view of a tip-to-tip channel gate contact pattern according to an embodiment. FIG. 8B is a top view of a side-by-side and to tip gate contact pattern according to another embodiment.

FIG. 9A is an expanded cross-sectional side view after recessing the work function metal stack 601 around the channels 301. The work function metal stack 601 is recessed to the surface of the gate metal 610 to expose the surface and sidewalls of the channels 301. The work function metal stack 601 may be recessed by, for example, a wet etch that is selective to the workfunction metal stack 601 over the gate metal 610.

Figure 9C:
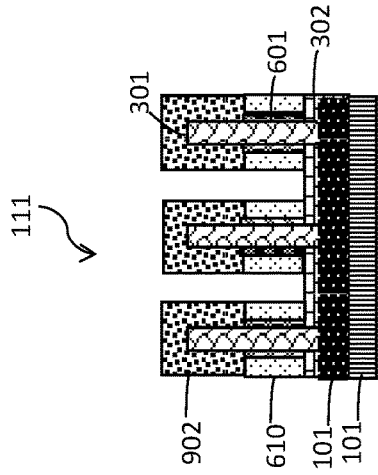
FIG. 9C is a cross-sectional side view after patterning the sacrificial spacer material and transferring the pattern into the gate metal.
Figure 9E:
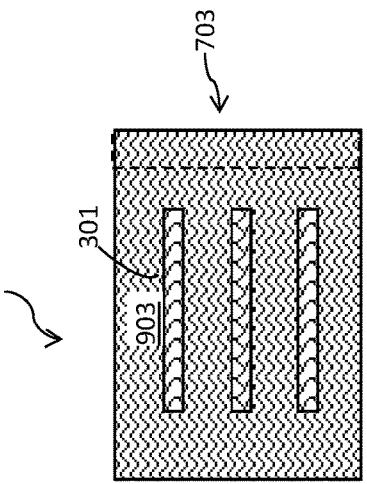
FIGS. 9D and 9E are a cross-sectional side view and top view, respectively, after removing the sacrificial spacer material and depositing a second spacer material.
Figure 9B:
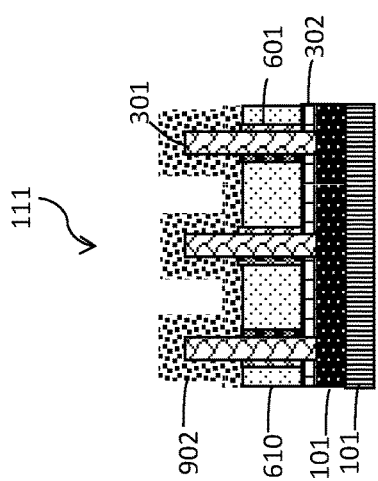
FIG. 9B is a cross-sectional side view after depositing a sacrificial spacer material on the channels.

FIG. 9B is a cross-sectional side view of the second transistor 111 in the region 901 shown in FIG. 9A after depositing a sacrificial spacer material 902 on the exposed channels 301. The sacrificial spacer material 902 covers the exposed surface and sidewalls of the channels 301 and is disposed on the recessed gate metal 610. The sacrificial spacer material 902 may be, for example, silicon nitride, silicon dioxide, a metallic oxide (e.g., hafnium dioxide), or a metallic nitride (e.g., titanium nitride, tantalum nitride), which can be deposited by, for example, low pressure chemical vapor deposition (LPCVD) or atomic layer deposition (ALD).

FIG. 9C is a cross-sectional side view of the second transistor 111 after patterning the sacrificial spacer material 902 and transferring the pattern into the gate metal 610. The sacrificial spacer material 902 is removed from the surface of the recessed gate metal 610 by, for example, a reactive ion etch (RIE). The sacrificial spacer material 902 remains disposed on the surface of the channel 301 and along sidewalls of the channel 301. The pattern from the sacrificial spacer material 902 disposed around the channels 301 is then transferred into the gate metal 610 by removing the gate metal 610 in the regions not protected by the sacrificial spacer material 902 to expose the first spacer material 302. A recess is formed between the gate metal 610 arranged on sidewalls of the channels 610, and gate stacks are formed on sidewalls of the channels 301 over the first spacer material 302.

Figure 9D:
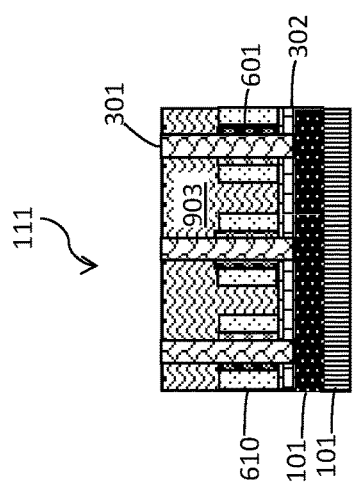

FIGS. 9D and 9E are a cross-sectional side view and top view, respectively, after removing the sacrificial spacer material 902 and depositing a second spacer material 903. Before depositing the second spacer material 903, the oxide 701 over the gate contact area 703 may also be removed. The second spacer material 903 fills the recesses between the channels 301 and the exposed sidewalls of the channel 301 where the gate stack (including the work function metal stack 601 and the gate metal 610) are not arranged. The second spacer material 903 may include any of the spacer materials described above for first spacer material 302 in FIG. 3A. The second spacer material 903 may be the same or different material as the first spacer material 302. The second spacer material 903 may be deposited by a GCIB process as described above for the first spacer material 302.

FIG. 10A is a cross-sectional side view after recessing the second spacer material 903 to partially expose the channels 301. The second spacer material 903 may be recessed by, for example, a wet etch in phosphoric acid, or a reactive ion etch (RIE). The second spacer material 903 is recessed such that a portion of the second spacer material 903 remains arranged on the gate stack (formed by the work function metal stack 601 and the gate metal 610) to form a top spacer. The top spacer over the gate stacks has substantially the same thickness in the first transistor 110 and the second transistor 111.

FIG. 10B is a cross-sectional side view after depositing an interlayer dielectric (ILD) 1001 on the second spacer material 903 and planarizing. The ILD 1001 is arranged in contact with sidewalls of the channels 301. The ILD 1001 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 1001 may be deposited by a deposition process, including, but not limited to CVD, PVD, plasma enhanced CVD, atomic layer deposition (ALD), evaporation, chemical solution deposition, or like processes. After deposition, the ILD 1001 may be polished by CMP down to the surface of the channel 301.

FIG. 10C is a cross-sectional side view after depositing a hard mask 1002 on the ILD 1001. Non-limiting examples of suitable materials for the hard mask 1002 include silicon oxide, silicon nitride, or any combination thereof.

FIG. 10D is a cross-sectional side view after patterning and etching through the ILD 1001 over the channel 301 regions of the first transistor 110. The hard mask 1002 is patterned (removed) over the first transistor 110 to protect the second transistor 111. The ILD 1001 is subsequently etched over the channels 301 to expose the channels 301 in the first transistor 110. The exposed 301 channels are then recessed by, for example, using a wet etch such as ammonium hydroxide, and/or a reactive ion etch to form openings/trenches over the channels 301 within the ILD 1001 or within the second spacer 903, depending on the recess depth.

Figure 10E:
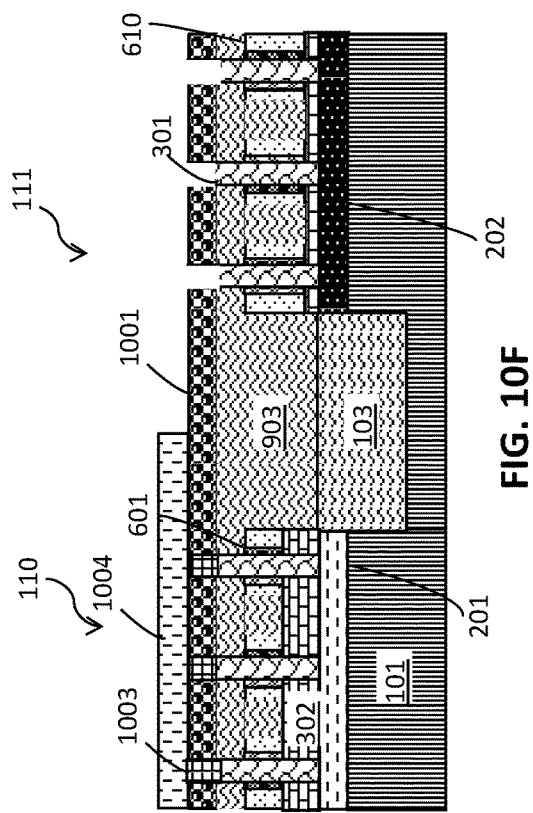
FIG. 10E is a cross-sectional side view after forming a source over the channel regions in the first transistor.

FIG. 10E is a cross-sectional side view after forming a first source 1003 over the channel 301 in the first transistor 110 and removing the hard mask 1002. The source 1003 may be formed by an epitaxial growth process as described above for the drain in FIG. 2C. The first source 1003 may include an epitaxial layer/growth extending from the channel 301.

Figure 10F:
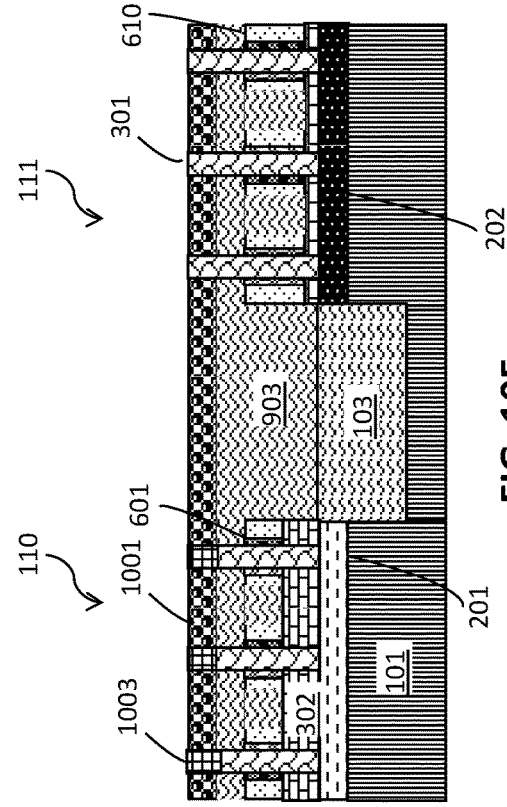
FIG. 10F is a cross-sectional side view after etching through the ILD over the channel regions of the second transistor.

FIG. 10F is a cross-sectional side view after depositing another hard mask 1004 and etching through the ILD 1001 over the channels 301 of the second transistor 111, as described above in FIG. 10D for the first transistor 110.

Figure 10G:
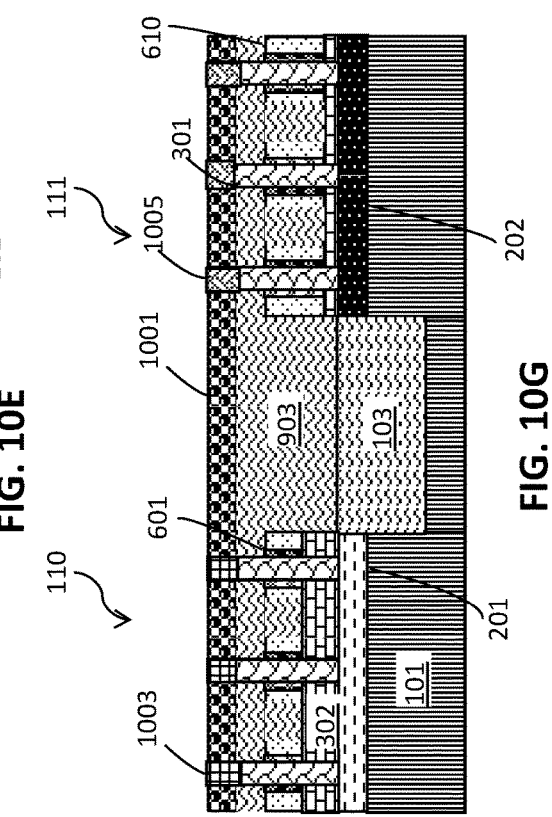

FIG. 10G is a cross-sectional side view after forming a second source 1005 over the channels 301 in the second transistor 111. The second source 1005 may include an epitaxial growth or layer as described above for the drain in FIG. 2C.

As mentioned above, the first source 1003 and the second source 1005 may be drains in some embodiments. The first source 1003 and the second source 1005 may be a source/drain.

After forming the first source 1003 and the second source 1005, another layer of ILD is deposited. Source contacts, drain contacts, and gate contacts may be formed from the source, drain and gate by forming trenches through the ILD to the source/drain or gate and filling one or more conductive materials. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
a first source/drain of a first transistor arranged on a substrate;
a second source/drain of a second transistor arranged on the substrate adjacent to the first source/drain;
a first spacer arranged on the first source/drain, a first channel extending from the first source/drain through the first spacer;
a second spacer arranged on the second source/drain, a second channel extending from the second source/drain through the second spacer, the first spacer and the second spacer having different thicknesses; and
a first gate stack arranged along sidewalls of the first channel and in contact with the first spacer, and a second gate stack arranged along sidewalls of the second channel and in contact with the second spacer.

2. The semiconductor device of claim 1, wherein a difference in thickness between the first spacer and the second spacer is about 1 to about 30 nm.

3. The semiconductor device of claim 1, further comprising spacer material arranged on the first gate stack and in contact with the first channel and on the second gate stack in contact with the second channel.

4. The semiconductor device of claim 3, further comprising an interlayer dielectric (ILD) arranged on the spacer material and in contact with sidewalls of the first channel and the second channel.

5. The semiconductor device of claim 4, further comprising source/drains arranged within openings formed in the ILD over the first channel and the second channel.

6. The semiconductor device of claim 1, wherein first spacer is a low-k material.

7. The semiconductor device of claim 1, wherein the second spacer is a low-k spacer material.

8. A semiconductor device, comprising:
a first source/drain of a first transistor arranged on a substrate;
a second source/drain of a second transistor arranged on the substrate adjacent to the first source/drain;
a first spacer arranged on the first source/drain, a first channel extending from the first source/drain through the first spacer;
a second spacer arranged on the second source/drain, a second channel extending from the second source/drain through the second spacer, the first spacer and the second spacer having different thicknesses and comprising a same spacer material; and
a first gate stack arranged along sidewalls of the first channel and in contact with the first spacer, and a second gate stack arranged along sidewalls of the second channel and in contact with the second spacer.

9. The semiconductor device of claim 8, wherein a difference in thickness between the first spacer and the second spacer is about 1 to about 30 nm.

10. The semiconductor device of claim 8, further comprising spacer material arranged on the first gate stack and in contact with the first channel and on the second gate stack in contact with the second channel.

11. The semiconductor device of claim 10, further comprising an interlayer dielectric (ILD) arranged on the spacer material and in contact with sidewalls of the first channel and the second channel.

12. The semiconductor device of claim 11, further comprising source/drains arranged within openings formed in the ILD over the first channel and the second channel.

13. The semiconductor device of claim 8, wherein first spacer is a low-k material.

14. The semiconductor device of claim 8, wherein the second spacer is a low-k spacer material.

15. A semiconductor device, comprising:
a first source/drain of a first transistor arranged on a substrate, the first source/drain comprising an epitaxial growth;
a second source/drain of a second transistor arranged on the substrate adjacent to the first source/drain, the second source/drain comprising an epitaxial growth;
a first spacer arranged on the first source/drain, a first channel extending from the first source/drain through the first spacer;
a second spacer arranged on the second source/drain, a second channel extending from the second source/drain through the second spacer, the first spacer and the second spacer having different thicknesses and comprising a same spacer material; and
a first gate stack arranged along sidewalls of the first channel and in contact with the first spacer, and a second gate stack arranged along sidewalls of the second channel and in contact with the second spacer.

16. The semiconductor device of claim 15, wherein a difference in thickness between the first spacer and the second spacer is about 1 to about 30 nm.

17. The semiconductor device of claim 15, further comprising spacer material arranged on the first gate stack and in contact with the first channel and on the second gate stack in contact with the second channel.

18. The semiconductor device of claim 17, further comprising an interlayer dielectric (ILD) arranged on the spacer material and in contact with sidewalls of the first channel and the second channel.

19. The semiconductor device of claim 15, wherein first spacer is a low-k material.

20. The semiconductor device of claim 15, wherein the second spacer is a low-k spacer material.

* * * * *